(12) United States Patent
Kato et al.

(10) Patent No.: US 7,489,910 B2
(45) Date of Patent: Feb. 10, 2009

(54) WIRELESS TRANSMITTER AND AMPLIFIER

(75) Inventors: Takayuki Kato, Kawasaki (JP); Hiroshi Yoshida, Yokohama (JP); Ichiro Seto, Tokyo (JP); Keiichi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 482 days.

(21) Appl. No.: 11/387,568

(22) Filed: Mar. 23, 2006

(65) Prior Publication Data

US 2006/0246855 A1 Nov. 2, 2006

(30) Foreign Application Priority Data

Mar. 30, 2005 (JP) ............... 2005-097911

(51) Int. Cl.
*H03C 7/02* (2006.01)
*H04B 1/02* (2006.01)

(52) U.S. Cl. .................. 455/101; 455/102; 455/127.2; 375/297; 330/250

(58) Field of Classification Search ................ 455/91, 455/101, 102, 127.2, 127.3; 375/295, 297; 330/250, 252, 253, 254
See application file for complete search history.

(56) References Cited

U.S. PATENT DOCUMENTS

| | | | |
|---|---|---|---|
| 5,420,541 A | 5/1995 | Upton et al. | |
| 5,668,502 A * | 9/1997 | Rijns | ........................... 330/254 |
| 6,084,387 A * | 7/2000 | Kaneko et al. | ............... 323/281 |
| 6,329,875 B1 * | 12/2001 | Ishida et al. | ................... 330/51 |
| 6,341,216 B1 * | 1/2002 | Itoh | ........................... 455/129 |

FOREIGN PATENT DOCUMENTS

JP 2004-179822 6/2004

OTHER PUBLICATIONS

Kenington, High-Linearity RF Amplifier Design, Chapter 8, Section 2, Artech House, 2000.

* cited by examiner

*Primary Examiner*—Quochien B Vuong
(74) *Attorney, Agent, or Firm*—Amin, Turocy & Calvin, LLP

(57) ABSTRACT

There is provided with an amplifier comprising: first and second power amplifiers; a first path configured to output first and second input signals to the first and second power amplifiers; a second path configured to divide a first input signal, output one of divided signals to the first power amplifier and output the other divided signal to the second power amplifier; a first path changeover unit configured to change over the first and second paths; a third path configured to output first and second power amplified signals from the first and second power amplifiers; a fourth path configured to combines a first power amplified signal through an impedance conversion unit from the first power amplifier and a second power amplified signal from the second power amplifier at a combining point and output a combined signal; and a second path changeover unit configured to changeover the third and fourth paths.

19 Claims, 11 Drawing Sheets

WIRELESS TRANSMITTER AND AMPLIFIER

CROSS-REFERENCE TO RELATED APPLICATIONS

This application claims the benefit of priority under 35USC §119 to Japanese Patent Application No. 2005-97911 filed on Mar. 30, 2005, the entire contents of which are incorporated herein by reference.

BACKGROUND OF THE INVENTION

1. Field of the Invention

The present invention relates to a wireless transmitter and amplifier to be used in a wireless communication system.

2. Description of the Background

In recent years, various techniques have been proposed to improve the data transmission rate in wireless communication systems. One of them is a technique called MIMO (Multi-Input Multi-Output).

The MIMO is a technique of transmitting a radio wave by using a plurality of analog transmitting series each including an antenna and receiving a radio wave by using a plurality of receiving series in the same way. The transmission rate can be increased using a phenomenon called multipath fading that a radio wave is subject to diffused reflection by a building or the like when the radio wave propagates through the space.

As an example, a conventional configuration of a MIMO transmitter having two transmitting series includes a baseband unit, first and second modulation units which modulate a baseband modulation signal output from the baseband unit, first and second power amplifiers which amplifies modulated signals respectively output from the first and second modulation units, and first and second antennas which radiate signals output from the first and second power amplifiers as radio waves.

The MIMO is the technique of increasing the transmission rate by using the phenomenon called multipath fading as described above. If the transmitter and the receiver are present in open places where the visibility is good, therefore, the transmission rate does not increase in some cases. In such a case, it might be effective to use only one transmitting series without utilizing the MIMO, from the viewpoint of the power dissipation as well because the operating circuit is reduced. Furthermore, in an area where a conventional system is being provided, it might become necessary to notify terminals that are used in the conventional system that the own machine will operate in MIMO hereafter. In such a case, even a transmitter for MIMO having a plurality of transmitting series is required to also operate by using only one transmitting series and communicate. In the ensuing description, the time when the MIMO transmitter operate in MIMO by using a plurality of transmitting series is referred to as "at the time of MIMO transmitting," and the time when the MIMO transmitter transmits a signal by activating only one transmitting series is referred to as "at the time of non-MIMO transmitting."

For making the signal level received by a receiver even at the time of non-MIMO transmitting equal to that at the time of MIMO transmitting, it is necessary to output signal from the transmitter at the time of MIMO transmitting equal to that at the time of non-MIMO transmitting. In such a case, a power amplifier to be used at the time of non-MIMO transmitting among power amplifiers included in a plurality of transmitting series that form a MIMO transmitter is required to have a capability of outputting a signal having a power level to be output by the transmitter in a specification range of distortion prescribed by the wireless communication system.

It is now supposed that the maximum output power level to be output by the transmitter is X [W] and N transmitting series are used at the time of MIMO transmitting. A power amplifier to be used at the time of non-MIMO transmitting must be able to output a signal with power of X [W] while satisfying distortion specifications prescribed by the wireless system. On the other hand, a maximum output power level to be output by each power amplifier at the time of MIMO transmitting becomes X/N [W] if the same power amplifiers are utilized. At the time of MIMO transmitting, it suffices that each power amplifier outputs a signal with maximum power of X/N [W] while satisfying distortion specifications prescribed by the wireless system. A difference in the maximum output level of one power amplifier between the non-MIMO transmitting and the non-MIMO transmitting becomes $(N-1) \times X/N$ [W].

In other words, if a MIMO transmitter having N transmitting series operates in non-MIMO, a power amplifier is required to output a signal having a signal level that is N times as high as that at the time of MIMO transmission.

In general, as the output level approaches a saturation output level in power amplifiers, the operation efficiency rises, but the distortion characteristics are degraded. On the other hand, as the output level becomes lower than the saturation level, the distortion characteristics are improved, but the operation efficiency is degraded. Causing a power amplifier to operate with the output of the power amplifier lowered below its saturation output level in order to satisfy distortion characteristics is referred to as "back-off." The difference between the saturation output level and the actual output level is referred to as "back-off level." If the power amplifier is brought into backoff operation, the operation efficiency is degraded. In a MIMO transmitter which operates in non-MIMO as described above, therefore, the power amplifier operate inefficiently when executing MIMO transmission.

In order to make the relation between the backoff level of the power amplifier and the operation efficiency comprehensible, the above-described conventional MIMO transmitter (a baseband unit, first and second modulation units, first and second power amplifiers, and first and second antennas) is taken as an example. The case where the transmission power of the transmitter required by the wireless communication system is 18 dBm (63 mW) and distortion specifications to be satisfied by the transmitter is −30 dBc or less will now be described specifically.

At the time of MIMO transmission, both the first power amplifier and the second power amplifier operate. Each of the two power amplifiers outputs a signal with power that is half of the power to be transmitted by the transmitter. Therefore, each of the two power amplifiers outputs a signal with transmission power of 15 dBm (32 mW) which is half of 18 dBm. In addition, the first power amplifier and the second power amplifier need to be −30 dBc or less in distortion level at this time.

On the other hand, if only one transmitting series including, for example, the first modulation unit, the first power amplifier and the first antenna is used, then the first power amplifier is required to be capable of outputting a signal with power of 18 dBm at the time of non-MIMO transmission. Furthermore, the distortion level of the first power amplifier must be −30 dBc or less.

Typically, in current small-sized power amplifiers for wireless communication terminal, a class AB amplifier or a class B amplifier is usually used. The amplifier used in the ensuing description may be either of a class AB amplifier and a class B amplifier. Therefore, a class B amplifier is taken as an example in the ensuing description. According to characteristics of the class B amplifier, the operation efficiency theoretically becomes the highest at the saturation output level, and the operation efficiency falls as the output level becomes lower. On the other hand, the distortion level becomes higher as the output level approaches the saturation output level.

As described earlier, it is necessary to bring the power amplifier in the backoff region in order to suppress the distortion level below the specification value. However, the required backoff level also depends upon the modulation method of the modulated signal transmitted by the transmitter. In the ensuing description, it is supposed that the concrete backoff level for satisfying the specification that the distortion level should be −30 dBc is 10 dB in order to make the description easy to understand and simple.

The power level at the time of transmitting in non-MIMO is 18 dBm, and the backoff level needed to obtain distortion characteristics satisfying specifications is 10 dB. Therefore, the saturation output level required for the first power amplifier becomes 28 dBm. FIG. 16 shows theoretical characteristics of the efficiency of the class B amplifier as a function of the output power. In this class B amplifier, the saturation output level is 28 dBm and the operation efficiency at the time of saturation output is 45%. The abscissa indicates the output power level, and the ordinate indicates the operation efficiency. In this case, the operation efficiency becomes 14% when the first power amplifier is operating with the output level of 18 dBm.

On the other hand, at the time of MIMO transmission, the output level of the first power amplifier becomes 15 dBm. Therefore, the operation efficiency becomes 10% on the basis of the characteristics shown in FIG. 16. As compared with the case where the output level is 18 dBm, the operation efficiency is degraded by 4%. If the same amplifier as the first power amplifier is used as the second power amplifier as well, the operation efficiency of the second power amplifier becomes 10% in the same way.

If the transmitter for MIMO transmission is required to operate in non-MIMO, the transmitter needs to have a power amplifier having a high saturation output level as heretofore described. Since the backoff level of the power amplifier at the time of MIMO transmission increases, a problem that the operation efficiency is degraded and the power dissipation of the transmitter increases occurs.

If it is made possible to transmit a signal by using only one transmitting series in the transmitter for MIMO transmission, it becomes necessary to provide power amplifiers having a high saturation output level, resulting in a problem of increased power dissipation of the transmitter at the time of MIMO transmission.

SUMMARY OF THE INVENTION

According to an aspect of the present invention, there is provided with a wireless transmitter comprising: a first modulation unit configured to modulate first input signal to first modulated signal; a second modulation unit configured to modulate second input signal to second modulated signal; a first amplifier configured to amplify the first modulated signal and output first amplified signal; a second amplifier configured to amplify the second modulated signal and output second amplified signal; a first antenna configured to radiate first amplified signal; a second antenna configured to radiate second amplified signal; a first path which conducts the first modulated signal to the first amplifier and conducts the second modulated signal to the second amplifier; a second path which divides the first modulated signal to conduct first divided signal to the first amplifier and second divided signal to the second amplifier; a first path changeover unit which conducts the first modulated signal and second modulated signal, to the first path or the second path selectively; a third path which conducts the first amplified signal to the first antenna, and conducts the second amplified signal to the second antenna; a fourth path which generates combined signal which is sum of the first amplified signal and the second amplified signal at a combining point, and conducts the combined signal to the first or second antenna; an impedance conversion unit which converts impedance between the first amplifier and the combining point; a second path changeover unit which conducts the first amplified signal and second amplified signal, to the third path or the fourth path selectively; and a control unit configured to set the first path changeover unit to conduct the first modulated signal and second modulated signal to the first path at the time to set the second path changeover unit to conduct the first amplified signal and second amplified signal to the third path, and configured to set the first path changeover unit to conduct the first modulated signal and second modulated signal to the second path at the time to set the second path changeover unit to conduct the first amplified signal and second amplified signal to the fourth path.

According to an aspect of the present invention, there is provided with an amplifier comprising: a first power amplifier configured to input a first input signal to obtain a first power amplification signal; a second power amplifier configured to input a second input signal to obtain a second power amplification signal; a divider configured to input a part of the first input signal into the second power amplifier as the second input signal, responsively to an external control signal; an impedance conversion unit configured to impedance-convert a supplied signal; a combiner configured to combine a signal impedance-converted by the impedance conversion unit and the second power amplification signal; and a selector configured to select supplying the first power amplification signal for the impedance conversion unit to output a combine signal obtained by the combiner, responsively to the external control signal, or outputting the first power amplification signal and the second power amplification signal respectively.

DESCRIPTION OF THE EMBODIMENTS

First, how the present inventors have made the present invention will now be described.

As a technique for reducing efficiency degradation in backoff operation of the amplifier described in BACKGROUND OF THE INVENTION, the Doherty amplifier described in, for example, "High-Linearity RF Amplifier Design" written by Peter B. Kenington is known.

Figure 8:
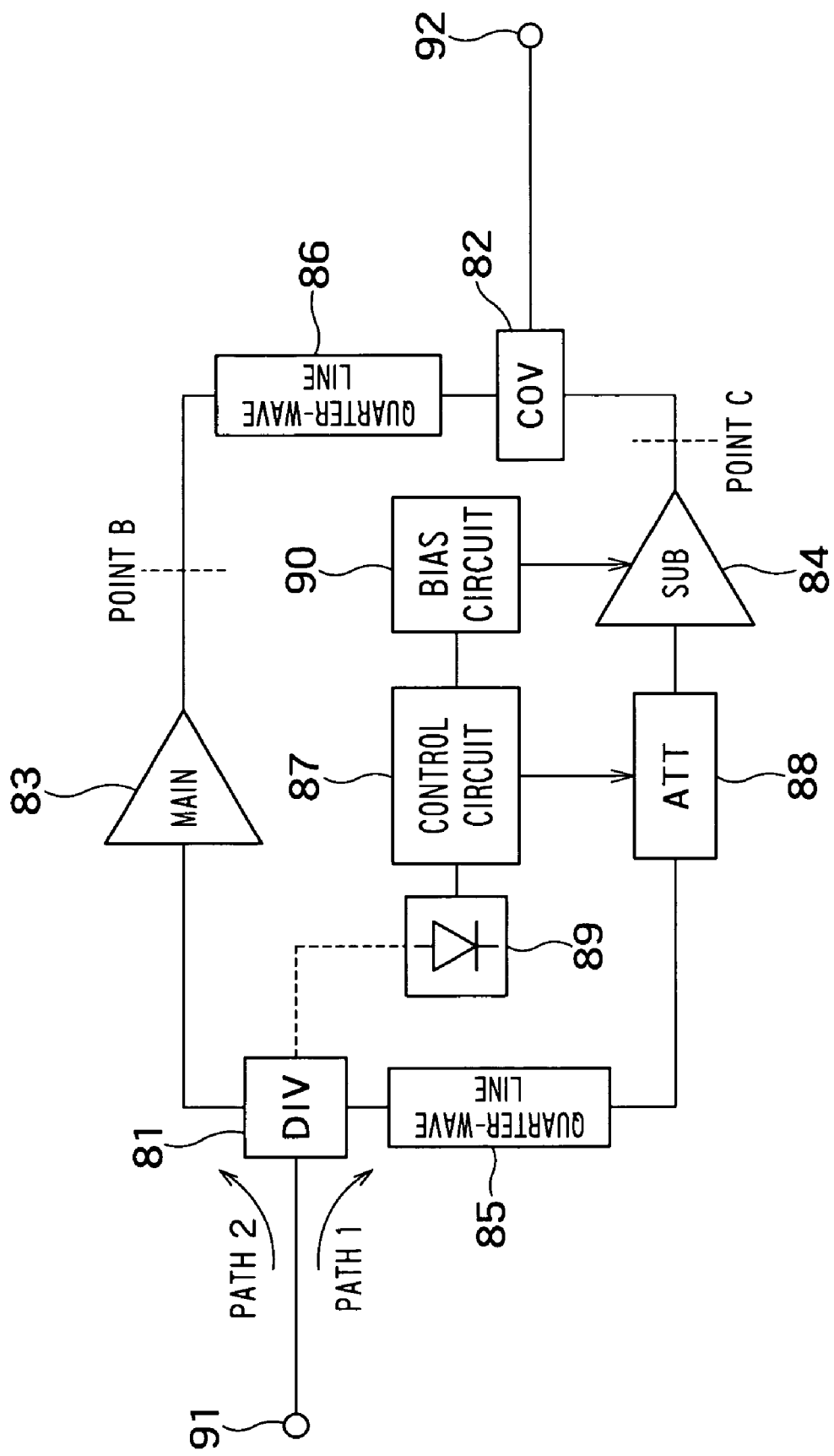
FIG. 8 is a diagram showing a configuration of a known Doherty amplifier.

The Doherty amplifier includes a main amplifier, a sub amplifier, a power divider which divides power between the main amplifier and the sub amplifier, an impedance conversion circuit which converts load impedance for the main amplifier, a phase adjustment circuit which adjusts a phase of a signal output from the sub amplifier, and a power combiner which combines outputs of the main amplifier and the sub amplifier. FIG. 8 shows a configuration example of a Doherty amplifier including one main amplifier and one sub amplifier. In FIG. 8, 81 denotes a power divider, 82 a power combiner, 83 a main amplifier, 84 a sub amplifier, 85 a quarter-wave line (used as the phase adjustment circuit), 86 a quarter-wave line (used as the impedance conversion circuit), 87 a control circuit, 88 a variable attenuator, 89 a power detector, 90 a bias circuit, 91 a signal input terminal, and 92 a signal output terminal. The quarter-wave line 85 is provided to adjust a phase shift caused by insertion of the quarter-wave line 86. The control circuit 87 is provided to control an attenuation level of the variable attenuator 88 which adjusts a bias of the sub amplifier 84 and an input signal level to the sub amplifier. By the way, the control circuit 87, the power detector 89, the variable attenuator 88 and the bias circuit 90 can be made unnecessary by providing the sub amplifier 84 with class C bias. Even if the number of amplifiers is not two as shown in FIG. 8, but is at least three, a Doherty amplifier can be implemented in principle. In the ensuing description, a Doherty amplifier having two amplifiers is taken as an example in order to make the description easily understandable.

In the Doherty amplifier, only the main amplifier is in operation when the output signal level is low, whereas the sub amplifier begins to be brought into operation as the output power increases. Therefore, the power dissipation can be reduced when the output level is low, and degradation of the operation efficiency can be reduced when the power amplifier is in the backoff operation. In addition, since the output power of the Doherty amplifier becomes the sum of the output power of the main amplifier and the output power of the sub amplifier, it is possible to raise the output level up to the level of the sum of the power levels the main amplifier and the sub amplifier can output. Hereafter, the operation principle of such a Doherty amplifier will be described.

As for the basic operation of the Doherty amplifier, only the main amplifier is brought into operation to perform amplification when the input signal level is equal to a certain value or less, whereas the sub amplifier is also brought into operation when the input signal level becomes at least the certain value. By the way, the signal level at which the sub amplifier begins to be brought into operation will be described in detailed operation description later. That is, if transistors having the same size (having equal saturation levels) are used in the main amplifier and the sub amplifier, a transistor having a substantially half size is used when the signal input level is low, whereas the transistor size is doubled when the input signal level is high. Thus, at the time of low output, the operation efficiency of the transistor is raised by making the transistor size small apparently. At the time of high output, the transistor size is made large apparently to increase the saturation output.

In addition, in the Doherty amplifier, an effect called "active load pull" is obtained. If the sub amplifier is brought into operation and the sub amplifier begins to supply power to the output load, the output load to the main amplifier is observed as if it has changed apparently. This is called active load pull effect. Owing to this effect, the main amplifier operates with a high impedance load bringing about a high operation efficiency, at the time of low output, and amplification operation can be done with a low impedance load bringing about a high output, at the time of high output when the sub amplifier is brought into operation.

Hereafter, operation of the Doherty amplifier will be described in more detail.

In the Doherty amplifier shown in FIG. 8, the input signal level is detected using the detector 89. When the input signal level has become at least a certain value, the sub amplifier 84 is turned on and both the main amplifier 83 and the sub amplifier 84 perform amplification operation. If the bias condition for the sub amplifier 84 is changed according to the input signal level in the above-described configuration, however, not only complicated control is needed, but also the circuit scale becomes large. Except the case where it is especially necessary to control on/off of the sub amplifier accurately, therefore, the above-described configuration is scarcely used. In recent years, a method of biasing the sub amplifier to class C and automatically turning on the sub amplifier as the input signal level becomes higher is wholly used. However, the basic operation is the same except a difference as to whether the bias control for the sub amplifier is executed automatically or by monitoring the input signal level. Hereafter, therefore, operation of the Doherty amplifier having the configuration shown in FIG. 8 will be described. In the ensuing description, it is supposed that the amplifiers 83 and 84 are equal in size. In other words, it is supposed that the amplifiers 83 and 84 output signals having equal levels at the time of maximum output when both the amplifiers 83 and 84 are in operation.

First, operation taken when the signal input level is low with only the main amplifier 83 in operation and the sub amplifier 84 in the off state will now be described.

A signal is input from the signal input terminal 91, and the signal is divided equally between a path 1 and a path 2 by the power divider 81. It is supposed that the signal input level is a low level at which it is not necessary to turn on the sub amplifier 84. At this time, the sub amplifier 84 is in the off state, and the sub amplifier 84 does not perform the amplification operation. Therefore, the sub amplifier 84 is supplied with a bias voltage (typically 0 V) which turns off the sub amplifier 84, from the bias circuit 90. The attenuation level of the attenuator 88 is set to a sufficiently large attenuation level of approximately −30 dB. As the power divider 81 shown in FIG. 8, a hybrid divider or a resistor divider can be used. However, it is now supposed as an example that a power divider using a distributed parameter line.

Figure 9:
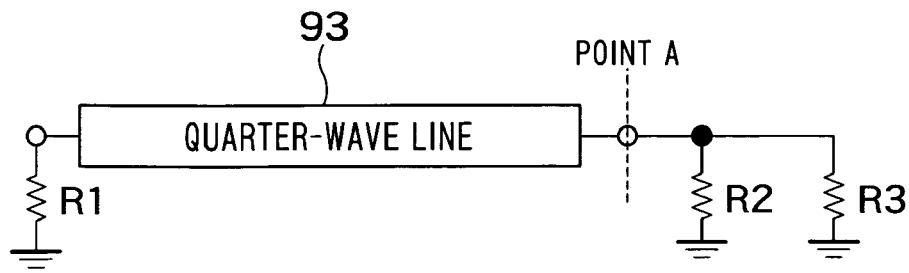
FIG. 9 is a diagram showing a power divider using a quarter-wave distributed parameter line.

FIG. 9 shows an example of the power divider using a distributed parameter line. Specifically, the power divider using the distributed parameter line shown in FIG. 9 is a transmission line 93 that becomes a quarter wavelength in length at a desired frequency. R1 is a load representing a circuit connected to an input signal terminal side. The load R1 has a value equal to the impedance of the circuit. R2 is a load representing the main amplifier 83. The load R2 has a value equal to the input impedance of the main amplifier. R3 is a load representing the quarter-wave line 85. The load R3 has a value equal to the characteristic impedance of the quarter-wave line.

A signal input to the attenuator 88 is dissipated as heat. On the other hand, a signal input to the main amplifier 83 is subject to power amplification in the main amplifier 83, and output from the signal output terminal 92 via the quarter-wave line 86 and the power combiner 82.

Figure 10:
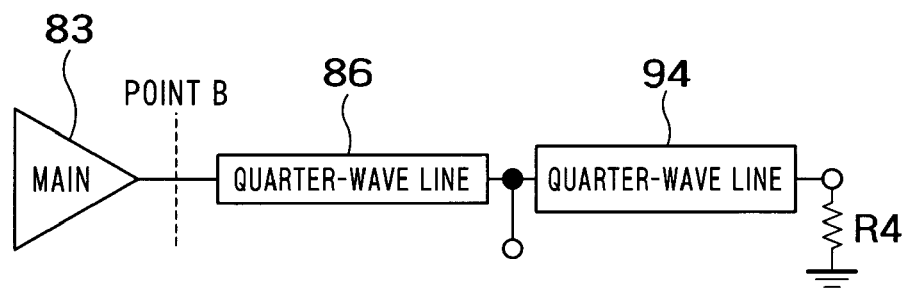
FIG. 10 is a diagram showing an output load of a main amplifier at the time when only the main amplifier is operating.

The output load of the main amplifier 83 will now be considered. The power divider shown in FIG. 9 can be used as the power combiner by reversing the input and output. As the power combiner 82 shown in FIG. 8, the same device as the power divider using the quarter-wave line shown in FIG. 9 is used. As shown in FIG. 10, the output load for the main amplifier 83 obtained by seeing the right side from a point B shown in FIG. 8 is observed as impedance of a load resistor R4 connected to the signal output terminal 92 seen via two quarter-wave lines 94 and 86 (supposed to have X Ω). If the signal input level is low and the sub amplifier 84 is in the off-state, therefore, the output load for the main amplifier 83 becomes X Ω.

The case where the main amplifier 83 is brought into the saturation state and the sub amplifier 84 is brought into the amplification operation will now be described.

The signal input from the signal input terminal 91 is divided equally between the path 1 and the path 2 by the power divider 81. The attenuation level of the attenuator 88 becomes small as the input signal level increases. The attenuation level of the attenuator 88 is controlled to finally become sufficiently small. Furthermore, the bias for the sub amplifier 84 is controlled according to the input signal level. Finally, the bias for the sub amplifier 84 is controlled to become the same bias condition as that for the main amplifier 83.

Signals input to the main amplifier 83 and the sub amplifier 84 are amplified, combined by the power combiner 82, and then output from the signal output terminal 92.

Figure 11:
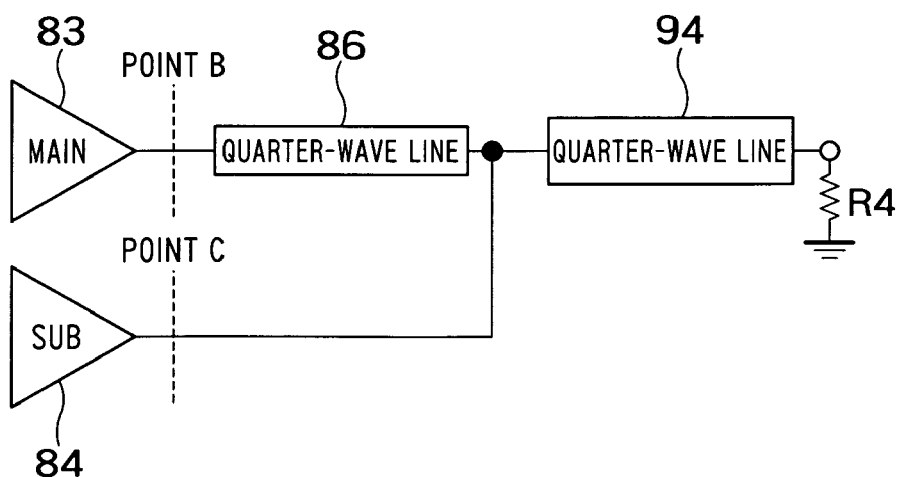
FIG. 11 is a diagram showing output loads of a main amplifier and a sub amplifier at the time when both amplifiers are in operation.

Output load conditions for the main amplifier 83 and the sub amplifier 84 will now be described. The load conditions of the output side of the main amplifier 83 and the sub amplifier 84 become as shown in FIG. 11.

If only the main amplifier 83 is in operation and the sub amplifier 84 does not output a signal, the output load for the main amplifier 83 is X Ω as described with reference to FIG. 10 in the same way as the operation at the time of low output. If the sub amplifier 84 begins to operate and supply a signal to the load R4 connected to the signal output terminal 92, the output load for the main amplifier 83 begins to gradually fall from X Ω. When finally the sub amplifier 84 comes to output a signal with the same output power as that of the main amplifier 83, i.e., when the sub amplifier 84 comes to supply a signal of the same level to the output load R4 connected to the signal output terminal 92, the output load for the main amplifier 83 is observed as if it is half of X Ω. Owing to such a change in the output load, it becomes possible to raise the output power level while keeping a high operation efficiency with the main amplifier 83 kept in the saturation state, when the sub amplifier 84 begins to operate.

Figure 12:
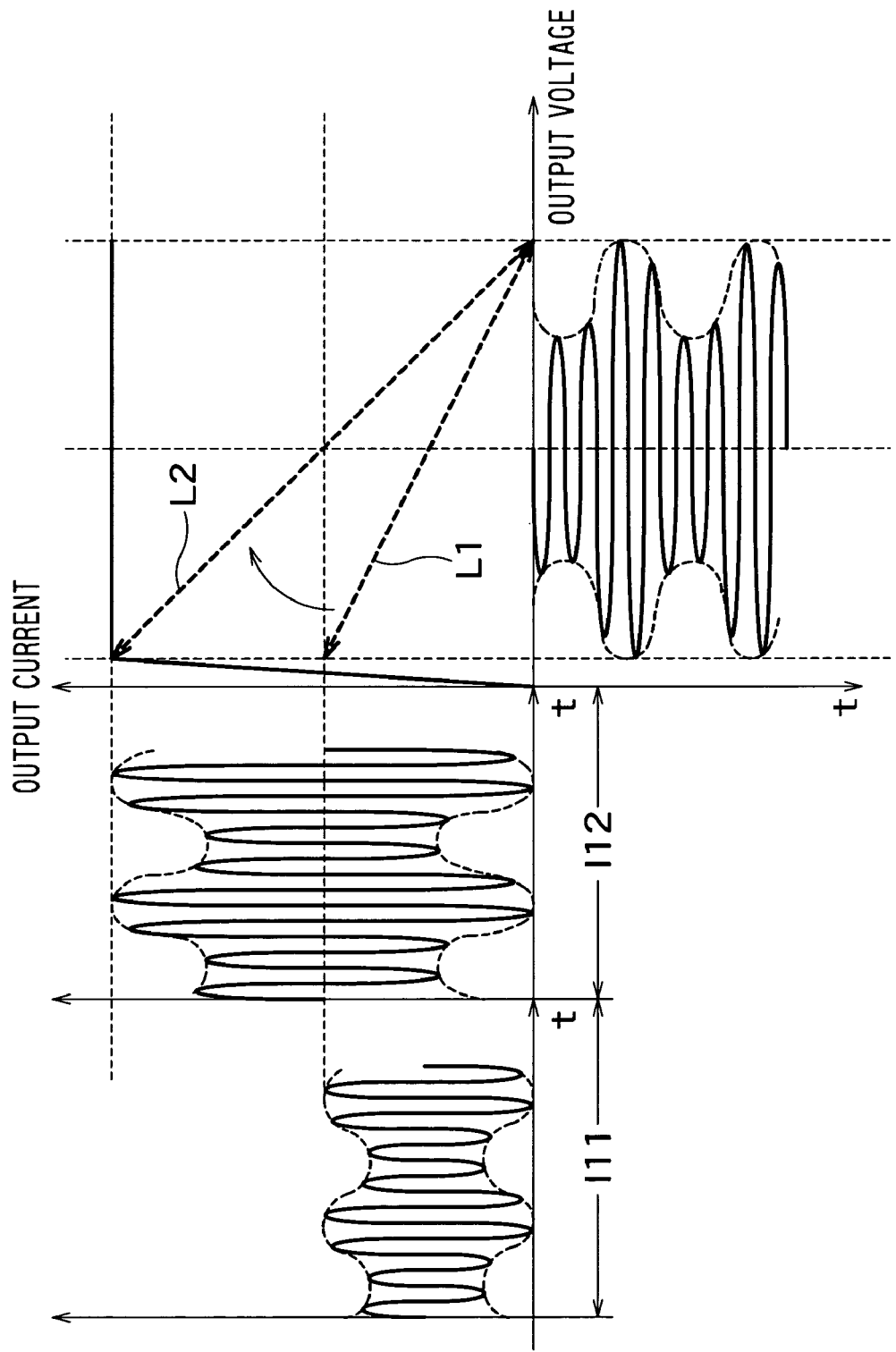
FIG. 12 is a diagram showing a change of an output current of a main amplifier.

FIG. 12 shows a load change, an output current and an output voltage of the main amplifier 83 at the time when the sub amplifier 84 begins to operate. L1 denotes a load line at the time when the sub amplifier 84 is in the off state. L2 denotes a load line at the time when both amplifiers are in the operation with maximum outputs. I11 denotes an output current at the time when the sub amplifier 84 is in the off-state. I12 denotes an output current at the time when both amplifiers are in the operation with maximum outputs. Since the output load of the main amplifier 83 changes from high impedance to low impedance as shown in FIG. 12, it becomes possible to increase the output power level by increasing the amplitude of the output current while keeping the output voltage amplitude in the constant saturation state. While the sub amplifier 84 shifts from the off-state to the state in which the sub amplifier 84 outputs the same signal level as the main amplifier 83 does, the amplitude of the current output by the main amplifier 83 is doubled. Therefore, the output signal level at the time when the main amplifier 83 and the sub amplifier 84 finally output signals at the same level becomes four times the signal level output when only the main amplifier 83 is in the operation.

On the other hand, conversely the output load for the sub amplifier 84 becomes a parallel connection composed of output impedance of the main amplifier 83 connected via the quarter-wave line 86 and the load R4 connected via the quarter-wave line 94. If the level of the signal supplied from the sub amplifier 84 to the load R4 connected to the signal output terminal 92 rises, however, the output load for the sub amplifier 84 is observed as gradually increased impedance. When the sub amplifier 84 has finally come to output a signal with the same output power as that of the main amplifier 83, the output load for the sub amplifier 84 is observed as high impedance as compared with impedance obtained when the sub amplifier is not in operation.

Figure 13:
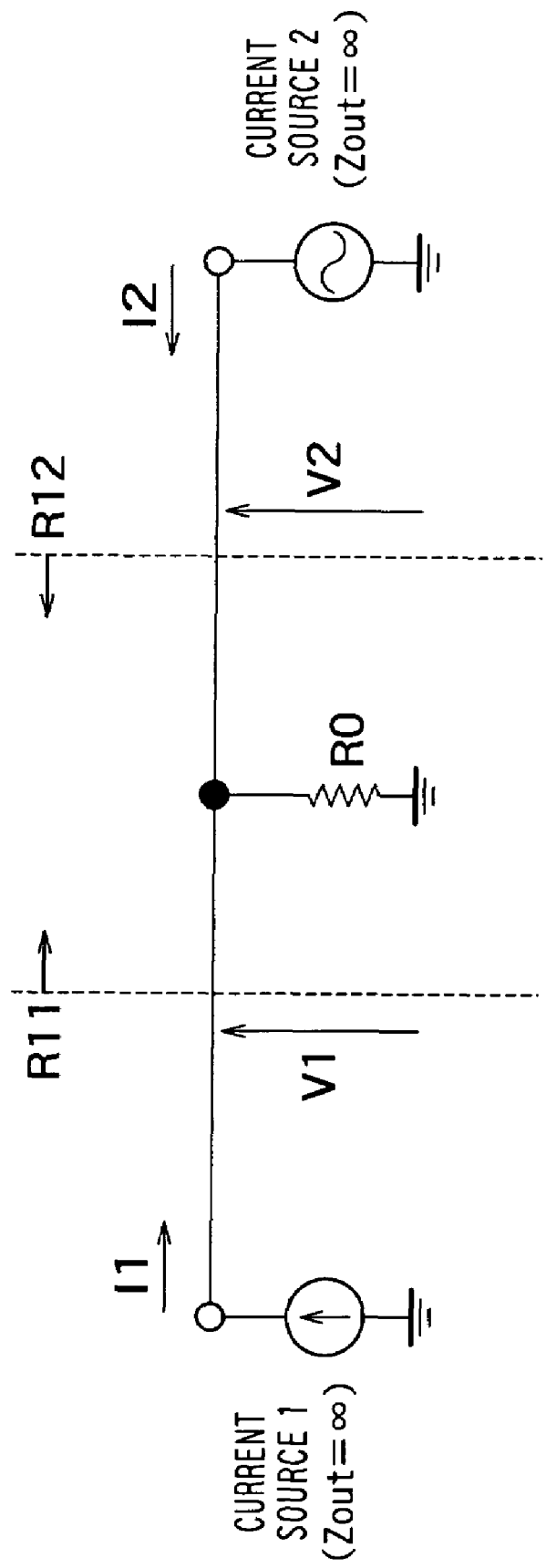
FIG. 13 is a diagram showing an active load pull effect.

If signals from two signal sources are input to one output load, the impedance of the output load is observed as if it has changed as described above. This phenomenon is called "active load pull effect." A signal is supplied from one signal source (a current source 1 in FIG. 13) to one output load R0 as shown in FIG. 13. If at this time a signal is supplied from another signal source (a current source 2 in FIG. 13) to the same output load R0, the output load for the current source 1 is observed as if it increases and the output load for the current source 2 is observed as if it decreases. This is the active load pull effect.

In other words, in FIG. 13, an output load R11 for the current source 1 is $R11=V1/I1=R0\times(I1+I2)/I1=R0+R0\times I2/I1$. If I2 increases, therefore, R11 increases. An output load R12 for the current source 2 is $R12=V2/I2=R0\times(I1+I2)/I2=R0+R0\times I1/I2$. If I2 increases, therefore, R12 decreases.

Owing to this active load pull effect and the quarter-wave line 86, the Doherty amplifier can operate in high efficiency by causing the output load for the main amplifier to have high impedance at the time of low output and operate in low distortion by causing the output load for the main amplifier to have low impedance at the time of high output.

Figure 14:
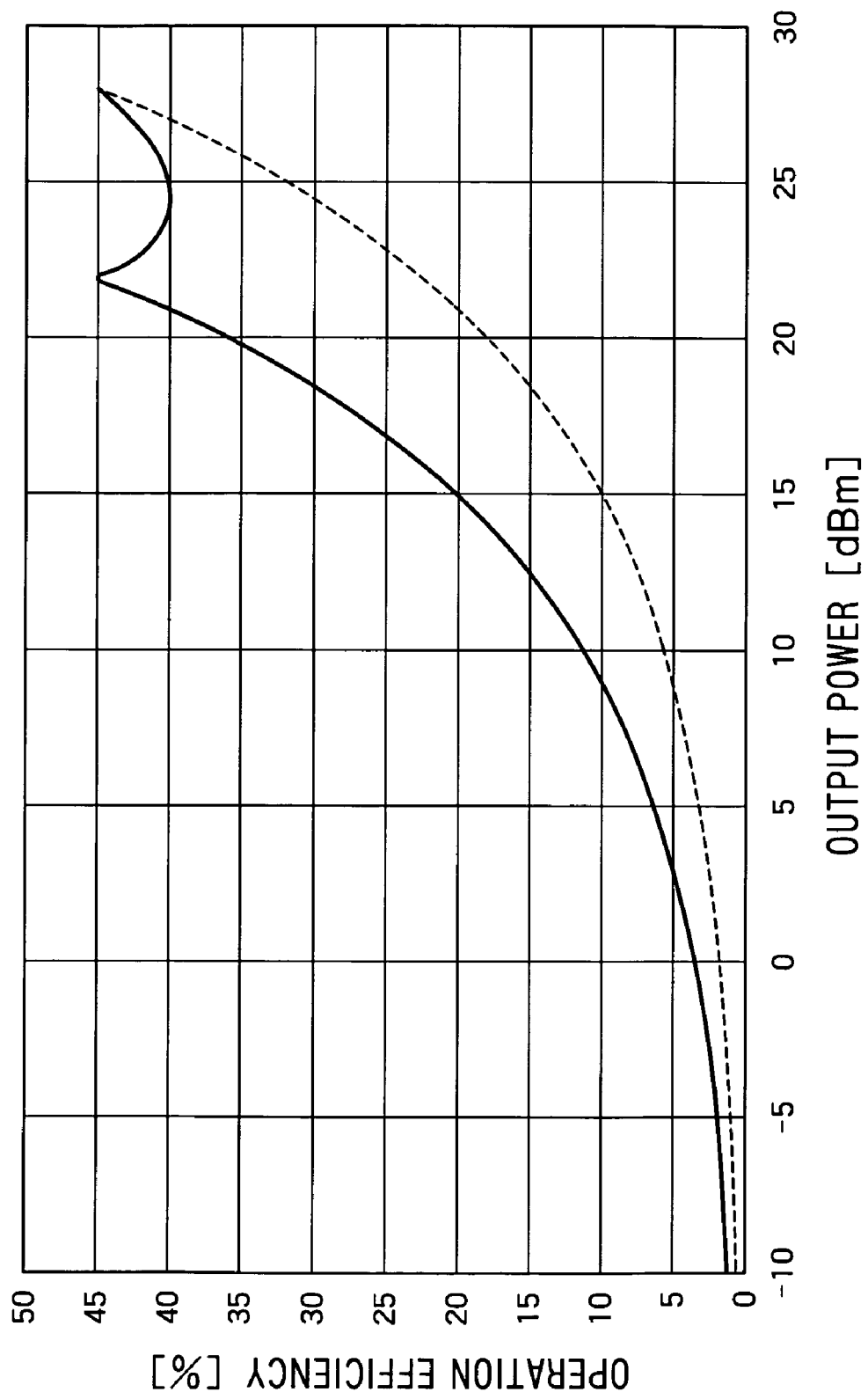
FIG. 14 is a diagram showing theoretical characteristics of operation efficiency of a Doherty amplifier formed of two class B amplifiers each having a saturation output level that is half of that of a class B amplifier shown in FIG. 16.
Figure 16:
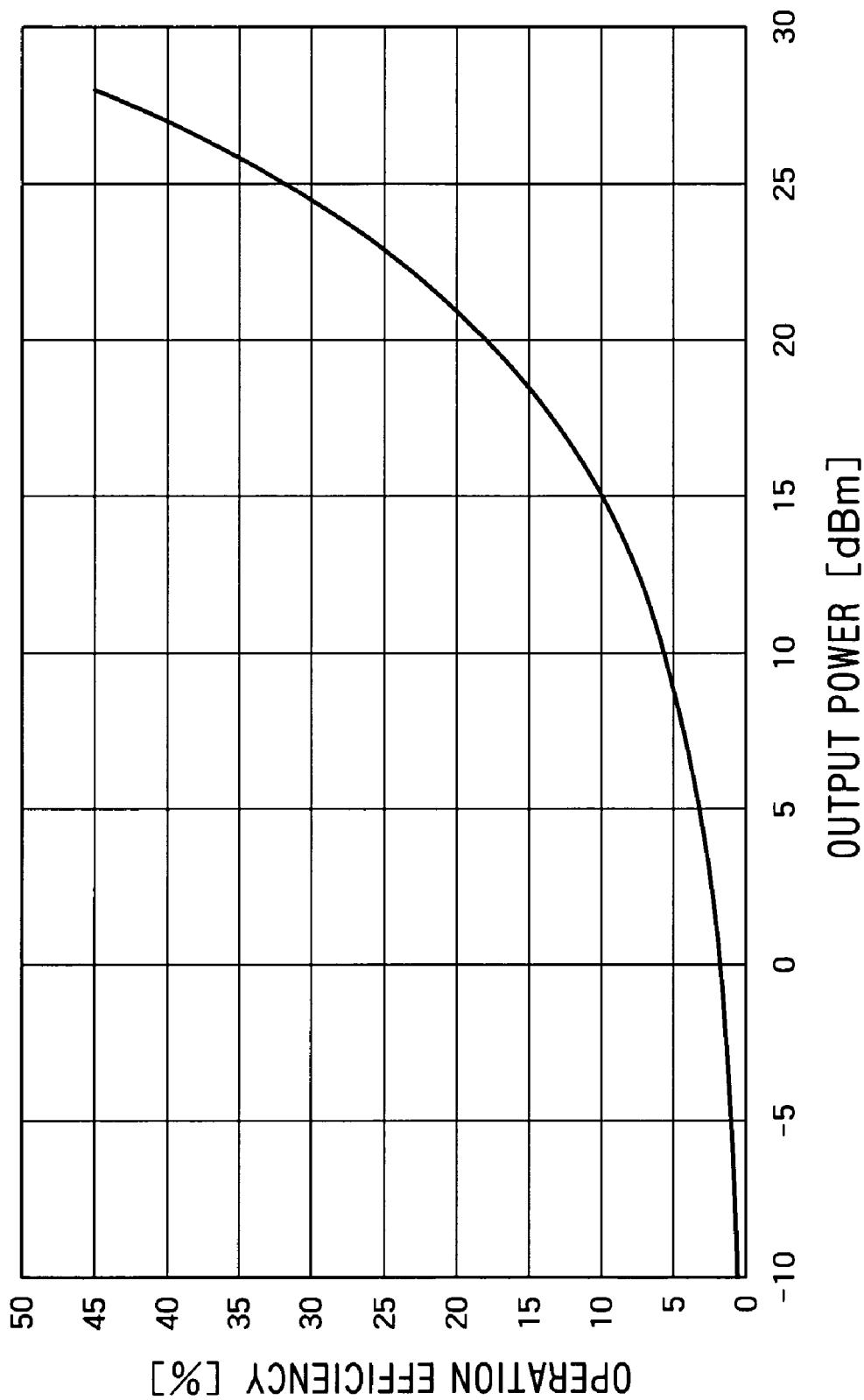
FIG. 16 is a diagram showing theoretical value characteristics of efficiency as a function of output power of a class B amplifier having a saturation output level of 28 dBm and operation efficiency of 45% at time of saturation output.

FIG. 14 shows theoretical characteristics of operation efficiency of a Doherty amplifier. In this Doherty amplifier, two amplifiers each having a saturation output level that is half of that of the class B amplifier having characteristics shown in FIG. 16, i.e., a saturation output level of 25 dBm are used as the main amplifier and the sub amplifier. The abscissa indicates the output power, and the ordinate indicates the operation efficiency. By the way, FIG. 14 shows the efficiency characteristics at the time when the input signal is CW (continuous wave) (a wave that is not modulated). Since a modulated signal is used in the actual wireless communication system, the efficiency characteristics shown in FIG. 14 change according to the kind of the modulated signal. However, there is no change in that the Doherty amplifier is more excellent in operation efficiency at the time of backoff operation than ordinary class B amplifiers. In the ensuing description, the efficiency characteristics of the CW wave are used. For the purpose of comparison, the operation efficiency of the class B amplifier shown in FIG. 16 is indicated by a dotted line. It is appreciated from FIG. 14 that the operation efficiency at the time of 10 dB backoff is approximately 12% higher in the Doherty amplifier than the class B amplifier. As described earlier, the output level at which the main amplifier and the sub amplifier are finally brought into the saturation state is four times, i.e., 6 dB higher than the output level obtained when only the main amplifier is brought into the saturation state. In the Doherty amplifier in which transistors having the same size are used in the main amplifier and the sub amplifier and the output load for the main amplifier changes twice, therefore, efficiency characteristics as shown in FIG. 14 are obtained.

There are two peaks in the efficiency characteristics. Hereafter, the reason will be described. Typically, the operation efficiency becomes higher as a transistor approaches the saturation operation. In the Doherty amplifier, the efficiency arrives at the peak once when the main amplifier approaches the saturation operation, and the efficiency arrives at the peak again when both the main amplifier and the sub amplifier are in operation and are brought into the saturation state.

In the Doherty amplifier, the operation efficiency at the time of low output can be raised as compared with the ordinary single end amplifier as heretofore described.

If the Doherty amplifier is utilized intact as the power amplifier in the MIMO transmitter, however, the size of the power amplifier becomes very large, resulting in larger size and higher price of the wireless unit in the transmitter. For example, if Doherty amplifiers each including one main amplifier and one sub amplifier are used as power amplifiers in an MIMO transmitter having two transmitting series, the number of used amplifiers becomes four. Furthermore, it becomes necessary to use two power dividers, two impedance converters and two phase adjusters or the like in the Doherty amplifiers. As a result, the circuit size of the power amplifiers increases to approximately twice.

Therefore, the present inventors have attempted to realize a wireless transmitter capable of transmitting with low power dissipation in either of transmission utilizing only one transmitting series and transmission utilizing a plurality of transmitting series, while preventing the size and price of devices from increasing as far as possible. As a result of exerting efforts repeatedly, the present invention has occurred to the present inventors. Hereafter, an embodiment of the present invention will be described in detail.

Figure 1:
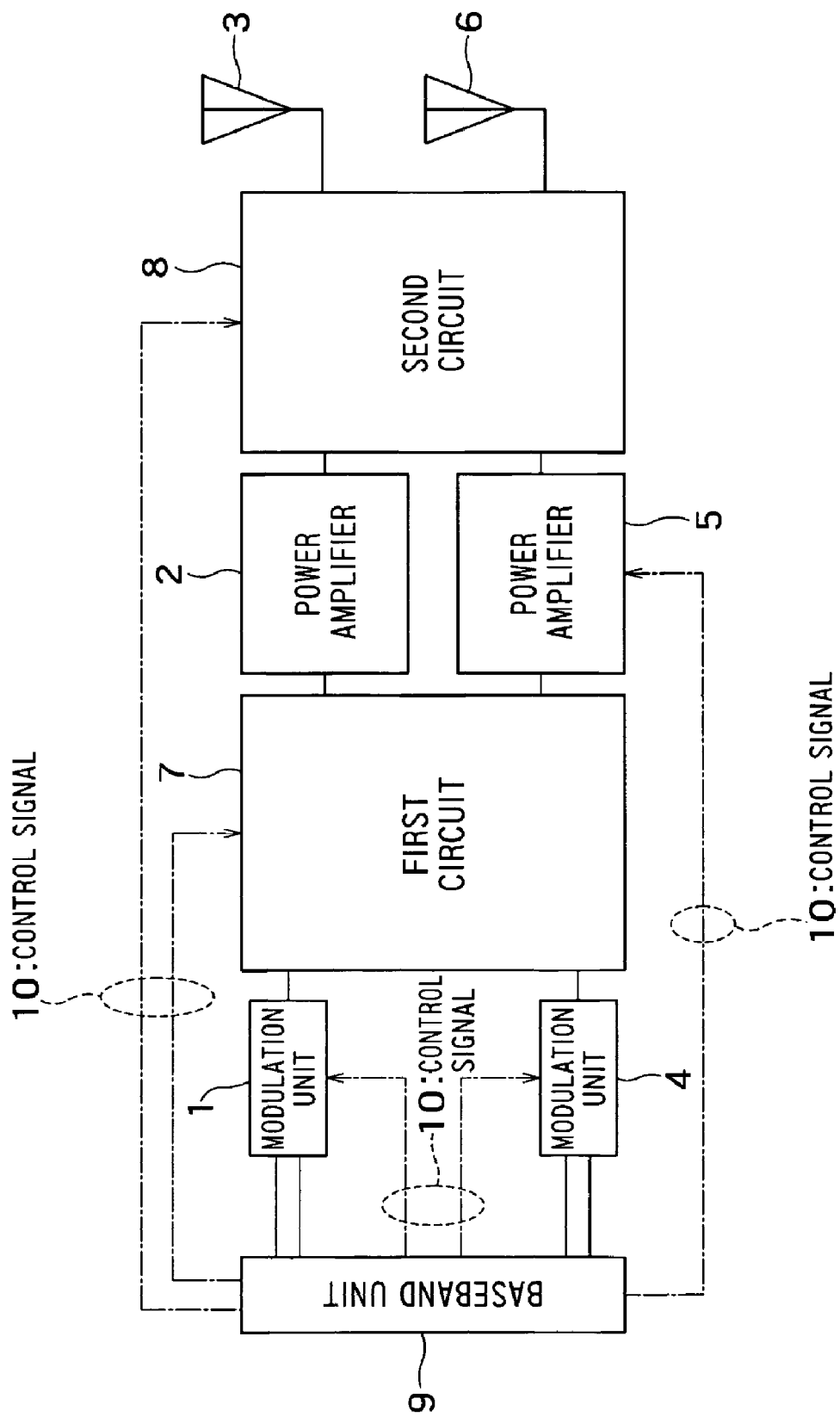
FIG. 1 is a diagram showing a configuration of a transmitter according to an embodiment of the present invention.

FIG. 1 shows an embodiment of a wireless transmitter according to the present invention. In FIG. 1, reference numeral 1 denotes a first modulation unit, 2 a first power amplifier, 3 a first antenna, 4 a second modulation unit, 5 a second power amplifier, 6 a second antenna, 7 a first circuit, 8 a second circuit, 9 a baseband unit, and 10 a control signal. In the present embodiment, the baseband unit 9 supplies the control signal. Alternatively, a control unit which supplies the control signal may be provided separately to supply the control signal.

If it is necessary to transmit a signal by using only one transmitting series in the MIMO transmitter having two transmitting series according to the present embodiment, a Doherty amplifier is constructed using the two power amplifiers and the signal is transmitted using one modulation unit and one antenna.

Hereafter, a wireless communication system in which a transmission signal frequency is 2 GHz and an output level of a signal output from a transmitter is 18 dBm is taken as an example. Concrete operation in the present embodiment will be described as to the case of MIMO transmission and the case of transmission using only one transmitting series.

In the present embodiment, it is supposed that each of the first modulation unit 1 and the second modulation unit 4 has output impedance of 50 Ω and the first power amplifier 2 has input impedance of 50 Ω and output impedance of 50 Ω. In addition, it is supposed that each of the first antenna 3 and the second antenna 6 also has input impedance of 50 Ω. As for the second power amplifier 5, each of input impedance and output impedance is 50 Ω at the time of MIMO transmission when the second power amplifier 5 is under the same operation condition as that of the first power amplifier 2. At the time of transmission using only one transmitting series serving as a sub amplifier in a Doherty amplifier, however, the output impedance assumes a sufficiently high value as compared with 50 Ω, although the input impedance is 50 Ω.

First, the case where the transmitter operates in the MIMO will now be described.

The baseband unit 9 inputs a baseband modulation signal to the first modulation unit 1 and the second modulation unit 4. Each of the first modulation unit 1 and the second modulation unit 4 converts the input baseband modulation signal to an RF modulated signal of 2 GHz to be transmitted by the transmitter, and outputs the RF modulated signal. Although the modulation technique used for the signal modulation is not the essence of the present invention, it is not concretely specified. However, a modulation technique used in wireless communication systems in recent years, such as 16QAM or OFDM, is conceivable.

Figure 2:
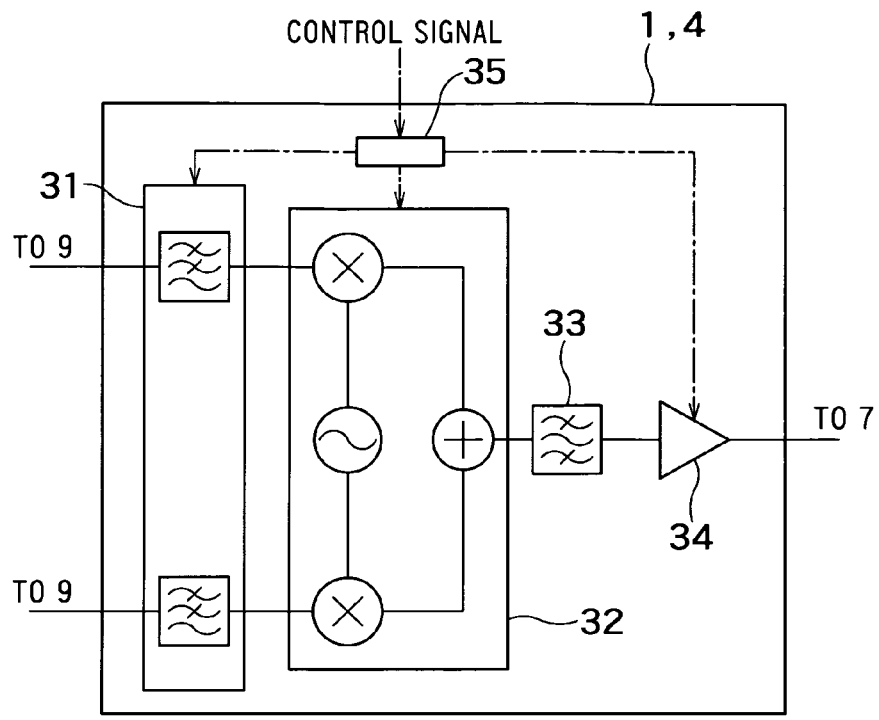
FIG. 2 is a diagram showing an example of first and second modulation units.

An example of a concrete configuration common to the first modulation unit 1 and the second modulation unit 4 in the present embodiment is shown in FIG. 2. In FIG. 2, reference numeral 31 denotes low-pass filters, 32 a quadrature modulator, 33 a band-pass filter, 34 a driver amplifier, and 35 a control signal distribution unit. The baseband signal modulated in the baseband unit 9 is input to the quadrature modulator 32 via the low-pass filters 31, up-converted to a radio frequency of 2 GHz, then input to the driver amplifier 34 via the band-pass filter 33, amplified therein, and output. The low-pass filters 31, the quadrature modulator 32 and the driver amplifier 34 included in each of the first modulation unit 1 and the second modulation unit 14 are supplied with a control signal from the baseband unit 9 via the control signal distribution unit 35. When the transmitter operates in the MIMO, both the first modulation unit 1 and the second modulation unit 4 are thus controlled so as to be brought into the operation state. When the transmitter operates the non-MIMO, either the first modulation unit 1 or the second modulation unit 4 is controlled so as to be brought into the suspension state depending upon the configurations of the first circuit 7 and the second circuit 8. In the case of the configuration of the present embodiment, the second modulation unit 4 is controlled to be brought into the suspension state. As for the control signal distribution unit 35, for example, a register is conceivable. In the case where the control signal is supplied as serial data from the baseband unit 9, the register stores the control signal. If a trigger signal is supplied, the register distributes and supplies the control signal to respective units. In the present embodiment, it is supposed that the levels of the signals output from the first modulation unit 1 and the second modulation unit 4 are 5 dBm, in order to make the description easily understandable.

Figure 3:
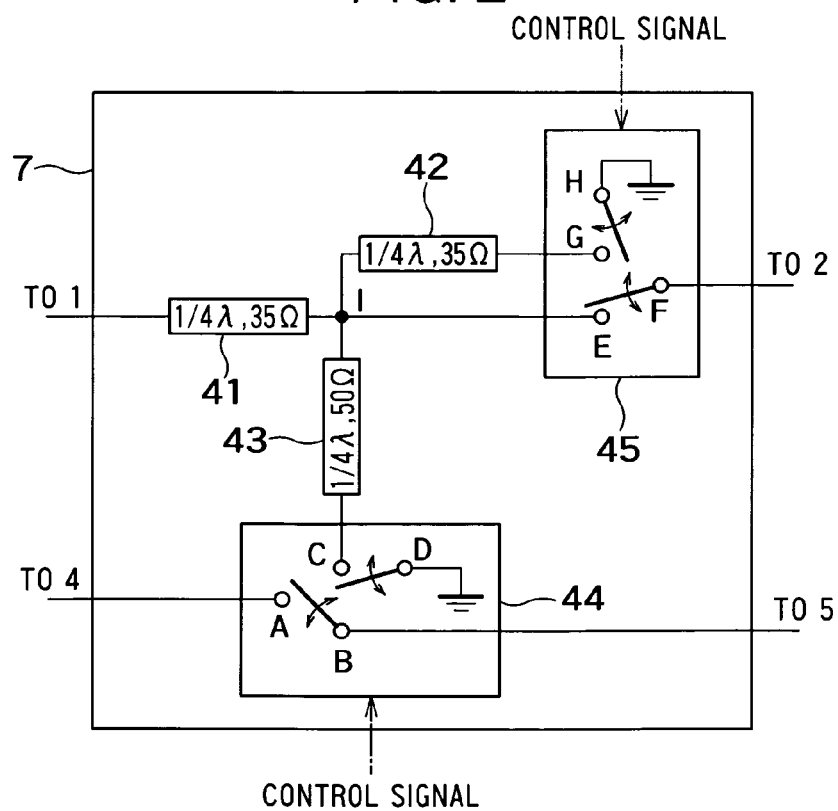
FIG. 3 is a diagram showing an example of a first circuit.

Signals output from the first modulation unit 1 and the second modulation unit 4 are input to the first circuit 7. FIG. 3 shows an example of the first circuit 7. In FIG. 3, each of reference numerals 41 and 42 denotes a quarter-wave line having characteristic impedance of 35 Ω. Reference numeral 43 denotes a quarter-wave line having characteristic impedance of 50 Ω. Reference numerals 44 and 45 denote switches. The switches 44 and 45 are controlled by the control signal output from the baseband unit 9.

Since the transmitter is now operating in the MIMO, the first circuit 7 functions to output the signals output from the first modulation unit 1 and the second modulation unit 4 to the first power amplifier 2 and the second power amplifier 5, respectively. In the present embodiment, a terminal A is connected to a terminal B and a terminal C is connected to a terminal D in the switch 44. In the switch 45, a terminal G is connected to a terminal F and terminals E and H are made open.

At this time, impedance obtained by seeing the first circuit 7 from the first modulation unit 1 will be considered. Impedance at a node I of the quarter-wave line 43 having the characteristic impedance of 50 Ω connected to the node I becomes open because the other end of the line is short-circuited at the terminal C in the switch 44. The input impedance 50 Ω of the first power amplifier 2 is converted to 25 Ω by the quarter-wave line 42 having the characteristic impedance 35 Ω; however, it is converted to the original 50 Ω by the quarter-wave line 41 having the characteristic impedance 35 Ω. Therefore, impedance obtained by seeing the first circuit 7 from the first modulation unit 1 becomes equal to the input impedance 50 Ω of the first power amplifier 2. Even if the first circuit 7 is provided between the first modulation unit 1 and the first power amplifier 2, therefore, the signal output from the first modulation unit 1 is input to the first power amplifier 2 without power loss caused by impedance mismatching in the same way as the case where the first modulation unit 1 is coupled directly to the first power amplifier 2.

On the other hand, impedance obtained by seeing the first circuit 7 from the second modulation unit 4 becomes equal to the input impedance 50 Ω of the second power amplifier 5 because the terminal A in the switch 44 is connected to the terminal B.

Thus, the signals output from the first modulation unit 1 and the second modulation unit 4 are input to the first power amplifier 2 and the second power amplifier 5, respectively.

Insertion loss in the first circuit 7 will now be described. The signal input from the first modulation unit 1 is input to the first power amplifier 2 via the two quarter-wave lines each having the characteristic impedance of 35 Ω and one switch. The signal input from the second modulation unit 4 is input to the second power amplifier 5 via one switch. If a quarter-wave line is formed on a ceramics substrate, the insertion loss is approximately 0.2 dB at 2 GHz. An insertion loss of a switch is in the range of approximately 1 dB to 2 dB. Therefore, the insertion loss of the switch is dominant as compared with the insertion loss of the quarter-wave line. Insertion losses in the two signal paths formed by the first circuit 7 are substantially equal, and they are in the range of approximately 1 dB to 2 dB. If the insertion loss of the quarter-wave line cannot be neglected, it is possible to correct the difference in insertion loss between the two signal paths by inserting a half wavelength line in the output of the switch 44. In the present embodiment, it is supposed that the insertion loss in the first circuit 7 is not present, in order to simplify the description of the operation. Even if the insertion loss of the first circuit 7 is 2 dB, contradiction in the description is avoided by raising the gains of the first power amplifier 2 and the second power amplifier 5 by 2 dB.

Signals input to the first power amplifier 2 and the second power amplifier 5 are amplified to have power of 15 dBm which is desired transmission power at the first antenna 3 and the second antenna 6. Since the level of the signals output from the first modulation unit 1 and the second modulation unit 4 is 5 dBm, the power gain of each of the first power amplifier 2 and the second power amplifier 5 is specifically 10 dB. In other words, the second power amplifier 5 is set to a bias condition by the control signal supplied from the baseband unit 9 so as to have the same gain as the first power amplifier 2.

Figure 6:
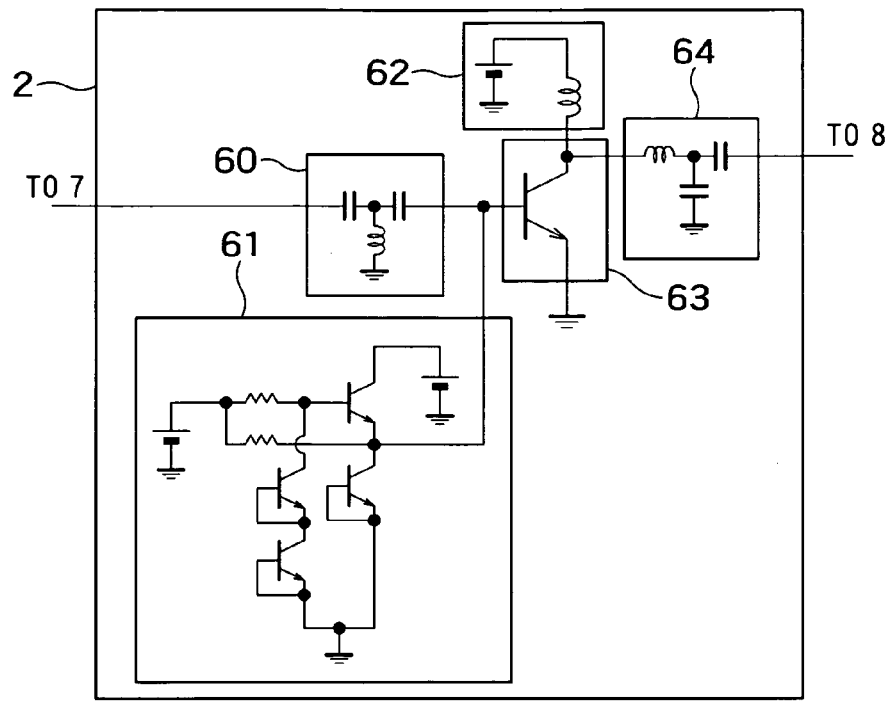
FIG. 6 is a diagram showing an example of a first power amplifier.
Figure 7:
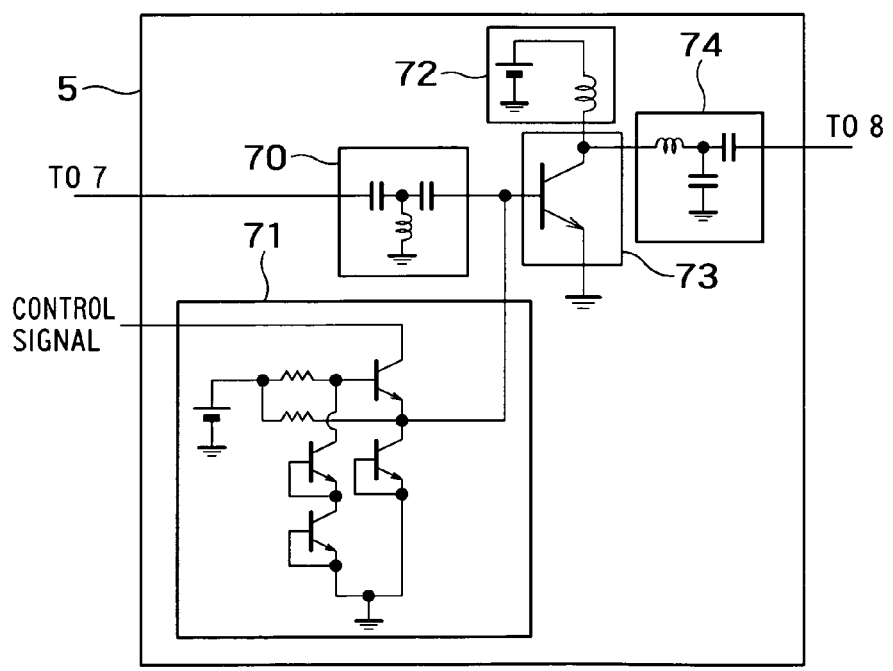
FIG. 7 is a diagram showing an example of a second power amplifier.

Examples of the first power amplifier 2 and the second power amplifier 5 in the present embodiment are shown in FIG. 6 and FIG. 7, respectively. In FIG. 6, reference numeral 60 denotes an input matching circuit, 61 a base bias circuit using an emitter follower, 62 a collector bias circuit, 63 a common-emitter amplifier circuit, and 64 an output matching circuit. In FIG. 7, reference numeral 70 denotes an input matching circuit, 71 a base bias circuit using an emitter follower controlled by the control signal, 72 a collector bias circuit, 73 a common-emitter amplifier circuit, and 74 an output matching circuit.

In the present embodiment, the first power amplifier 2 is basically the same in configuration as the second power amplifier 5. However, they differ from each other only in whether the base bias circuit using the emitter follower which supplies the base bias current to the common-emitter amplifier circuit 63 or 73 is controlled by the control signal.

In the present embodiment, each of the first power amplifier 2 and the second power amplifier 5 is operating in class AB at a time of the MIMO transmission. At the time of non-MIMO transmission, the first power amplifier 2 operates in class AB and the second power amplifier 5 operates in class C. In other words, the base bias current of the first power amplifier 2 shown in FIG. 6 at the time of MIMO transmission is the same as that at the time of non-MIMO transmission. On the other hand, as for the base bias current of the second power amplifier 5 shown in FIG. 7, the base bias circuit 71 using the emitter follower supplies the base bias current to the common-emitter amplifier circuit 73 according to the control signal supplied from the baseband unit 9 so as to bring the common-emitter amplifier circuit 73 into the class AB operation at the time of MIMO transmission and bring the common-emitter amplifier circuit 73 into the class C operation at the time of non-MIMO transmission. In the base bias circuit 71 using the emitter follower for the second power amplifier 5 in the present embodiment shown in FIG. 7, it is possible to control the base bias current supplied to the common-emitter amplifier circuit by using the voltage value itself of the control signal supplied from the baseband unit 9. Specifically, therefore, the operation of the common-emitter amplifier circuit 73 can be changed from the class AB operation to the class C operation by lowering the control voltage supplied to the base bias circuit 71 using the emitter follower below the voltage value at the time of MIMO transmission.

Signals output from the first power amplifier 2 and the second power amplifier 5 are input to the second circuit 8.

Figure 4:
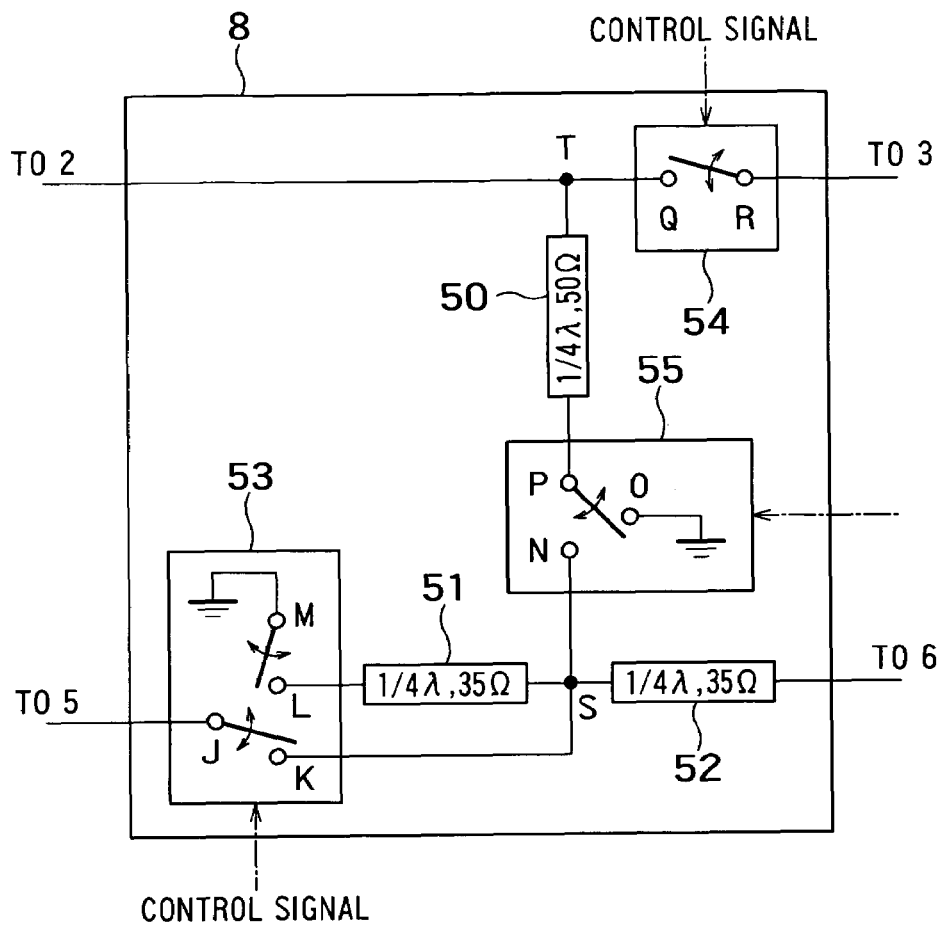
FIG. 4 is a diagram showing an example of a second circuit.

FIG. 4 shows an example of the second circuit 8. In FIG. 4, reference numeral 50 denotes a quarter-wave line having characteristic impedance of 50 Ω. Each of reference numerals 51 and 52 denote a quarter-wave line having characteristic impedance of 35 Ω. Reference numerals 53, 54 and 55 denote switches. The switches 53, 54 and 55 are controlled by the control signal output from the baseband unit 9.

Since the transmitter is now operating in the MIMO, the second circuit 8 functions to output the signals output from the first power amplifier 2 and the second power amplifier 5 to the first antenna 3 and the second antenna 6, respectively. In the present embodiment, a terminal J is connected to a terminal L and terminals M and K are opened in the switch 53. In the switch 54, a terminal Q is connected to a terminal R. In the switch 55, a terminal P is connected to a terminal O and a terminal N is opened.

Impedance obtained by seeing the second circuit 8 from the first power amplifier 2 at this time will be considered. Impedance at a node T of the quarter-wave line 50 having the characteristic impedance of 50 Ω connected to the node T becomes open because the terminal P is connected to the terminal O in the switch 55 and consequently the other end of the line is short-circuited. Since the terminal Q is connected to the terminal R in the switch 54, impedance obtained by seeing the second circuit 8 from the first power amplifier 2 becomes equal to the input impedance 50 Ω of the first antenna 3.

On the other hand, impedance obtained by seeing the second circuit 8 from the second power amplifier 5 will now be considered. Since the terminal K in the switch 53 and the terminal N in the switch 55 are open, two quarter-wave lines each having the characteristic impedance of 35 Ω are connected to a node S. The input impedance 50 Ω of the second antenna 6 is converted to 25 Ω by the quarter-wave line 52 having the characteristic impedance 35 Ω; however, it is converted to the original 50 Ω by the quarter-wave line 51 having the characteristic impedance 35 Ω, and it becomes equal to the input impedance 50 Ω of the second antenna 6. Therefore, impedance obtained by seeing the second circuit 8 from the second power amplifier 5 becomes equal to the input impedance 50 Ω of the first antenna 6. Even if the second circuit 8 is provided between the second power amplifier 5 and the second antenna 6, therefore, the signal output from the second power amplifier 5 is input to the second antenna 6 without power loss caused by impedance mismatching in the same way as the case where the second power amplifier 5 is coupled directly to the second antenna 6.

Insertion loss in the second circuit 8 will now be described in the same way as the case of the first circuit 7. The signal input from the first power amplifier 2 is input to the first antenna 3 via one switch. The signal input from the second power amplifier 5 is input to the second antenna 6 via the two quarter-wave lines each having the characteristic impedance 35 Ω and one switch. In the same way as the case of the first circuit 7, the insertion loss of the switch is dominant as compared with the insertion loss of the quarter-wave line. Insertion losses in the two signal paths formed by the second circuit 8 are substantially equal, and they are in the range of approximately 1 to 2 dB. If the insertion loss of the quarter-wave line cannot be neglected, it is possible to reduce the difference in insertion loss between the two signal paths by inserting a half wavelength line in the input of the switch 54. By the way, it is supposed that the insertion loss in the second circuit 8 is not present, in order to simplify the description.

As heretofore described, a signal having the output level of 15 dBm is output from each of the first antenna 3 and the second antenna 6. As for the transmitter as a whole, signals are output with an output level of 18 dBm.

Operation taken when transmitting a signal by using only one transmitting series, i.e., when constructing a Doherty amplifier using the two power amplifiers and transmitting the signal by using one modulation unit and one antenna will now be described.

In the present embodiment, it is supposed that the first modulation unit 1 is used as the modulation unit and the second antenna 6 is used as the antenna. Operation while a signal is supplied from the baseband unit 9 to the first circuit 7 is similar to the operation in the first modulation unit 1 at the time of MIMO transmission described earlier. The signal output from the first modulation unit 1 is input to the first circuit 7.

First, operation of the first circuit 7 will now be described.

In FIG. 3, the first circuit 7 is controlled to function as a power divider circuit which divides the signal input from the first modulation unit 1 between the first power amplifier 2 and the second power amplifier 5 in accordance with the control signal supplied from the baseband unit 9. Specifically, in the switch 44, the terminal B is connected to the terminal C and the terminals A and D are opened. In the switch 45, the terminal E is connected to the terminal F, and the terminal G is connected to the terminal H.

At this time, the node I is connected to the quarter-wave line 42 having the characteristic impedance of 35 Ω with the other end being in the short-circuit state, the quarter-wave line 41 having the characteristic impedance of 35 Ω with the other end being connected to the first modulation unit 1 having the output impedance of 50 Ω, the first power amplifier 2 having the input impedance of 50 Ω, and the quarter-wave line 43 having the characteristic impedance of 50 Ω with the other end being connected to the second power amplifier 5 having the output impedance of 50 Ω.

The state of impedance matching at the node I will now be described. The impedance of the quarter-wave line 42 having the characteristic impedance of 35 Ω with the other end being in the short-circuit state becomes large enough to be regarded as the open state. The impedance of the quarter-wave line 41 having the characteristic impedance of 35 Ω with the other end being connected to the first modulation unit 1 having the output impedance of 50 Ω becomes 25 Ω. This is connected to the first power amplifier 2 having the input impedance of 50 Ω, and the quarter-wave line 43 having the characteristic impedance of 50 Ω with the other end being connected to the second power amplifier 5 having the output impedance of 50 Ω. Therefore, matching can be attained with the impedance of 25 Ω. As a result, a power divider is formed, and the power divider divides the signal output from the first modulation unit 1 between the first power amplifier 2 and the second power amplifier 5 and delays the phase of the signal input to the second power amplifier 5 as compared with the phase of the signal input to the first power amplifier 2 by 90°.

In this way, the signal output from the first circuit 7 is divided and input to the first power amplifier 2 and the second power amplifier 5.

Operation of the second circuit 8 will now be described.

In FIG. 4, the second circuit 8 is controlled to output signals output from the first power amplifier 2 and the second power amplifier 5 to the second antenna 6 according to the control signal supplied from the baseband unit 9. Specifically, in the switch 53, the terminal J is connected to the terminal K and the terminal L is connected to the terminal M. In the switch 54, the terminals Q and R are opened. In the switch 55, the terminal P is connected to the terminal N, and the terminal O is opened.

At this time, the node S is connected to the quarter-wave line 51 having the characteristic impedance of 35 Ω with the other end being in the short-circuit state, the quarter-wave line 50 having the characteristic impedance of 50 Ω with the other end being connected to the first power amplifier 2 having the output impedance of 50 Ω, the quarter-wave line 52 having the characteristic impedance of 35 Ω with the other end being connected to the second antenna 6 having the input impedance of 50 Ω, and the second power amplifier 5 having the output impedance of 50 Ω.

The state of impedance matching at the node S will now be described. The impedance of the quarter-wave line 51 having the characteristic impedance of 35 Ω with the other end being in the short-circuit state becomes large enough to be regarded as the open state. The impedance of the quarter-wave line 50 having the characteristic impedance of 50 Ω with the other end being connected to the first power amplifier 2 having the output impedance of 50 Ω becomes 50 Ω. This is connected to the second power amplifier 5 having output impedance that is sufficiently large as compared with 50 Ω, and the quarter-wave line 52 having the characteristic impedance of 35 Ω with the other end being connected to the second antenna 6 having the output impedance of 50 Ω. Since, at this time, the output impedance of the second power amplifier 5 is sufficiently large as compared with 50 Ω in the present embodiment, in the above-described state, impedance matching is not attained at the node S. When a signal is output from the sub amplifier, however, it is necessary to consider in the Doherty amplifier the influence of the phenomenon that the output load for the power amplifier is changed by the "active load pull effect" and observed. If design is done so as to attain the impedance matching at the node S by using the "active load pull effect," therefore, there is no problem. As a result, a power combiner is formed. In the power combiner, the signal output from the first power amplifier 2 lags in phase by 90° as compared with the signal input from the second power amplifier 5, and then signals output from the first power amplifier 2 and the second power amplifier 5 are added up.

Figure 5:
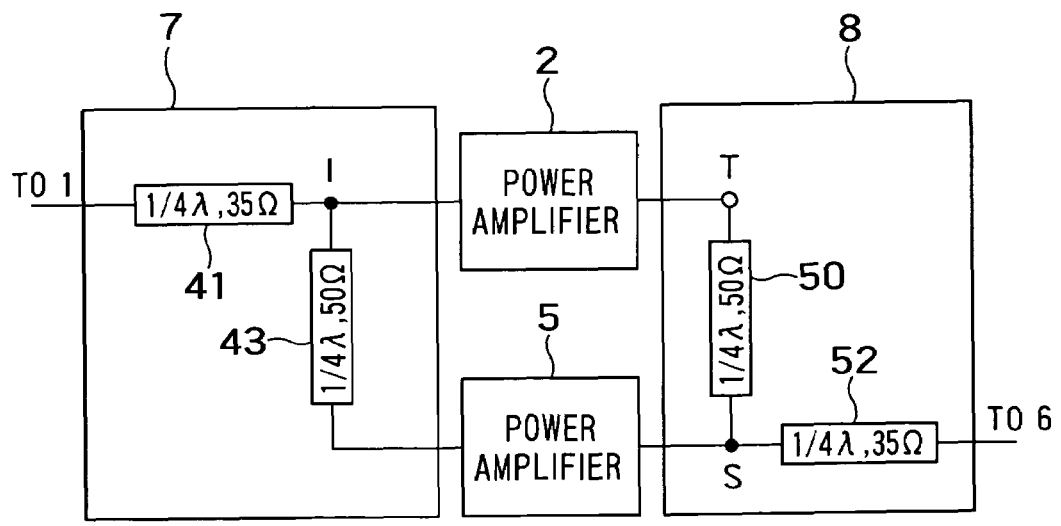
FIG. 5 is a diagram showing a Doherty amplifier formed of a first circuit, a second circuit, a first power amplifier and a second power amplifier when transmitting a signal by using only one transmitting series.

FIG. 5 shows a circuit formed by the first circuit 7, the first power amplifier 2, the second power amplifier 5 and the second circuit 8 at the time of non-MIMO transmission in the present embodiment heretofore described. Comparing FIG. 5 with FIG. 8, the circuit configuration shown in FIG. 5 is the same as the circuit configuration of the Doherty amplifier having the first power amplifier 2 as the main amplifier 83, the second power amplifier 5 as the sub amplifier 84, the quarter-wave line 41 having the characteristic impedance 35 Ω in the first circuit 7 as the power divider 81, the quarter-wave line 43 having the characteristic impedance 50 Ω as the quarter-wave line 85, the quarter-wave line 50 having the characteristic impedance 50 Ω in the second circuit 8 as the quarter-wave line 86, and the quarter-wave line 52 having the characteristic impedance 35 Ω as the power combiner 82. The quarter-wave line (phase adjustment unit) 43 having the characteristic impedance 50 Ω is provided to adjust the phase lag caused by the insertion of the quarter-wave line 50 having the characteristic impedance 50 Ω. Since an amplifier subjected to class C bias is used as the sub amplifier in the present embodiment, the control circuit 87, the power detector 89, the variable attenuator 88 and the bias circuit 90 shown in FIG. 8 become unnecessary.

Therefore, the baseband unit 9 sends the control signal to the second power amplifier 5 to provide the second power amplifier 5 with the class C bias, and thereby the circuit formed of the first circuit 7, the first power amplifier 2, the second power amplifier 5 and the second circuit 8 functions as a Doherty amplifier which amplifies the signal output from the first modulation unit 1.

In the Doherty amplifier, only the main amplifier is in operation when the input signal level is low, whereas the sub amplifier begins to operate as the input signal level rises. In the present embodiment, the second power amplifier 5 used as the sub amplifier is caused to operate as a class C amplifier. As the input signal increases, the bias current gradually increases and the second power amplifier 5 is brought into the on-state to have a gain. When only the main amplifier is in operation, the output load for the main amplifier has a large value causing high efficiency operation. When the sub amplifier begins to operate, however, the phenomenon called "active load pull effect" occurs, and values of output loads for the main amplifier and the sub amplifier are observed as if they change. If the quarter-wave line 50 is used as the impedance converter such as in the present embodiment, the value of the output load for the main amplifier decreases and higher output operation becomes possible.

The basic operation principle of the Doherty amplifier is described in detail in "High-Linearity RF Amplifier Design" written by Peter B. Kenington and described earlier. Therefore, only operation by the Doherty amplifier formed of the first circuit 7, the first power amplifier 2, the second power amplifier 5 and the second circuit 8 when each of the first power amplifier 2 and the second power amplifier 5 outputs a signal at 15 dBm which is the maximum output level will now be described.

The signal input from the first modulation unit 1 is divided between the first power amplifier 2 and the second power amplifier 5 by the power divider formed of the first circuit 7.

It is supposed that the first power amplifier 2 and the second power amplifier 5 in the present embodiment has a gain of 10 dB at the time of MIMO transmission and at the time of non-MIMO transmission. In other words, at the time of non-MIMO transmission, the gain of the second power amplifier 5 subjected to the class C bias becomes 10 dB. At this time, the level of the signal output from the first modulation unit 1 is specifically 8 dB.

In the present embodiment, the gain value of the first power amplifier 2 and the second power amplifier 5 at the time of MIMO transmission is made equal to that at the time of non-MIMO transmission. Therefore, the output power level of the first modulation unit 1 at the time of non-MIMO transmission becomes 3 dB higher that at the time of MIMO transmission. This is true of the conventional transmitter, so long as the gain of the power amplifiers at the time of MIMO transmission is the same as that at the time of non-MIMO transmission as in the present embodiment. In other words, in both the conventional transmitter and the transmitter in the present embodiment, the power dissipation increases because the output level of the first modulation unit 1 becomes 3 dB higher.

In the present embodiment, it is supposed that the first power amplifier 2 and the second power amplifier 5 have the same gain, as described above. Therefore, signals having the same level are supplied to the first power amplifier 2 and the second power amplifier 5. In other words, a signal of 5 dBm is input to each of the first power amplifier 2 and the second power amplifier 5.

Signals input to the first power amplifier 2 and the second power amplifier 5 are subject to power amplification and output to the second circuit 8 with the output level of 15 dBm. At this time, the first power amplifier 2 and the second power amplifier 5 are supplied with signals having the same level as that at the time of MIMO transmission described earlier, and the first power amplifier 2 and the second power amplifier 5 output signals having the same level. Therefore, the operation efficiency of the first power amplifier 2 and the second power amplifier 5 becomes the same as that at the time of MIMO transmission.

In the second circuit 8, the power combiner is formed. Therefore, signals output from the first power amplifier 2 and the second power amplifier 5 are added up, and a resultant signal is input to the second antenna 6 as a signal having an output level of 18 dBm.

As heretofore described, a signal having an output level of 18 dBm is output from the second antenna 6. As for the transmitter, a signal is output with the same output level of 18 dBm as that at the time of MIMO transmission.

Figure 15:
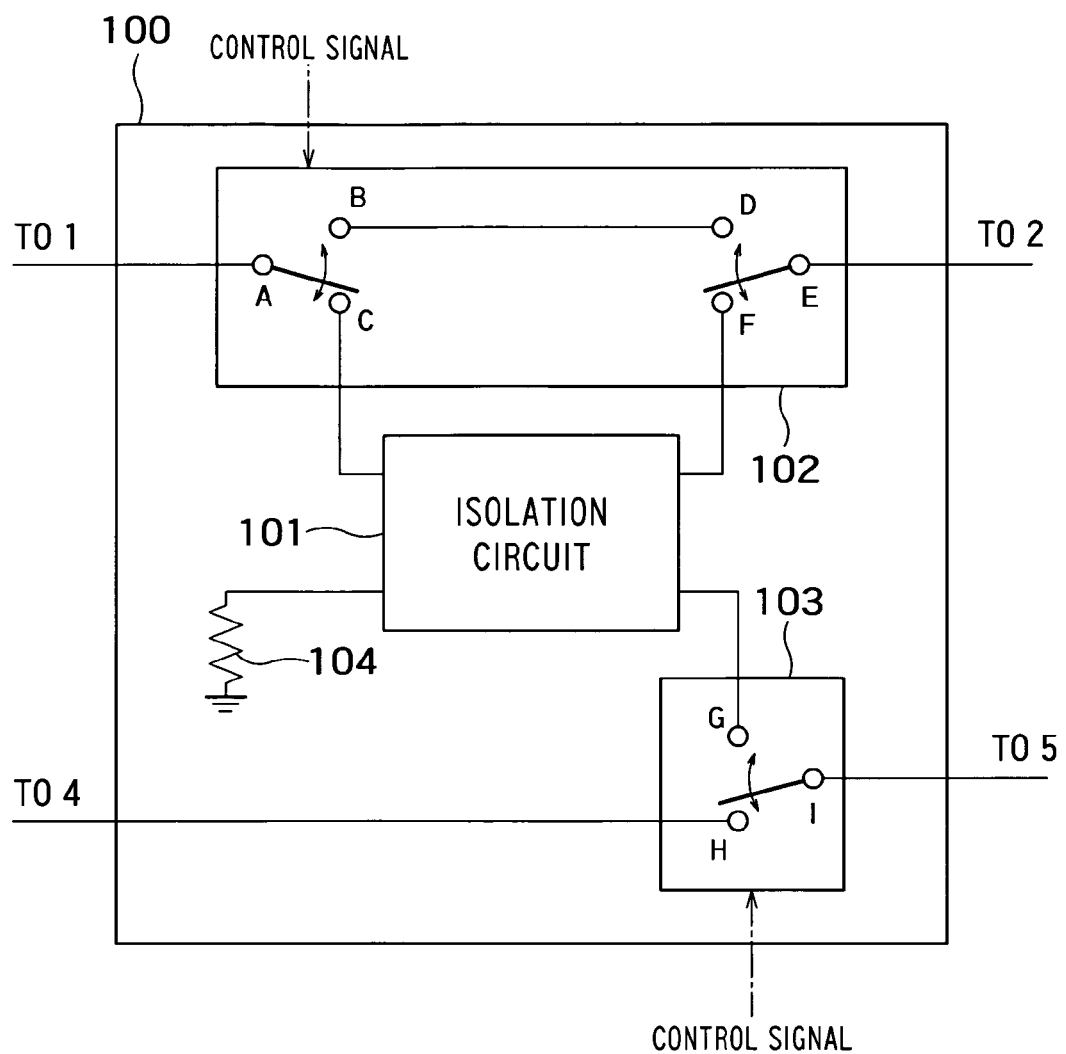
FIG. 15 is a diagram showing another configuration example of a first circuit.

FIG. 15 shows another configuration example of the first circuit 7. The first circuit 100 includes an isolation circuit 101 which ensures isolation between output terminals and generates a phase difference of 90 degrees between output signals.

In the first circuit 100, therefore, isolation between the two output terminals can be ensured. Therefore, isolation between input terminals of the first power amplifier 2 and the second power amplifier 5 is also ensured. When constructing the Doherty amplifier using the first power amplifier 2 and the second power amplifier 5, therefore, input impedances of the two power amplifiers do not affect each other. As a result, the input matching circuits in the power amplifiers can be designed at comparative ease.

Furthermore, since providing a phase difference of 90 degrees between the output signals, the first circuit 100 implements function equivalent to that of the power divider formed of the quarter-wave line 41 having the characteristic impedance of 35 Ω and the quarter-wave line 43 having the characteristic impedance of 50Ω in the first circuit 7 shown in FIG. 3.

Hereafter, the first circuit 100 will be described in more detail.

In FIG. 15, reference numeral 101 denotes an isolation circuit which provides isolation between the output terminals and provides a phase difference of 90 degrees between the output signals. Reference numeral 102 denotes a first switch circuit, 103 a second switch circuit, and 104 a terminator.

In the isolation circuit 101, it is possible to use a 3 dB branch line coupler described in, for example, "Microwave technique guide course (foundation volume)" written by Eiji Mori and published by CQ publishing company. The configuration and design method of the 3 dB branch line coupler are described therein. According to this book, isolation of at least 30 dB between output terminals can be ensured at 1.5 GHz.

In the isolation circuit 101, it is also possible to use a phase shifter including semiconductor transistors described in, for example, Junghyun KIM, et al., "A Highly-Integrated Doherty Amplifier for CDMA Handset Applications Using an Active Phase Splitter," IEEE Microwave and Wireless Components Letters, vol. 15, No. 5, May 2005. According to this document, isolation of at least 10 dB can be ensured.

Operation of a transmitter including the first circuit 100 is the same as the transmitter including the first circuit 7 except operation of the first circuit 100. Therefore, operation of the first circuit 100 will be described mainly.

First, the case where the transmitter including the first circuit 100 operates in the non-MIMO will now be described. In FIG. 15, the first circuit 100 is controlled by the control signal supplied from the baseband unit 9 to function as a power divider circuit which divides the signal input from the first modulation unit 1 between the first power amplifier 2 and the second power amplifier 5. Specifically, in the first switch circuit 102, a terminal A is connected to a terminal C and a terminal F is connected to a terminal E. In the second switch circuit 103, a terminal G is connected to a terminal I.

In this way, the signal input from the first modulation unit 1 is divided into two signals having the same power level and a phase difference of 90 degrees between, by the isolation circuit 101. The resultant two signals are input to the first power amplifier 2 and the second power amplifier 5.

On the other hand, when the transmitter operates in the MIMO, the first circuit 100 functions to output the signal input from the first modulation unit 1 to the first power amplifier 2 and output the signal input from the second modulation unit 4 to the second power amplifier 5, in response to the control signal supplied from the baseband unit 9. Specifically, in the first switch circuit 102, the terminal A is connected to a terminal B and a terminal D is connected to the terminal E. In the second switch circuit 103, a terminal H is connected to the terminal I.

Thus, the signal input from the first modulation unit 1 is output to the first power amplifier 2, and the signal input from the second modulation unit 4 is output to the second power amplifier 5.

Except the operation of the first circuit 100 heretofore described, operations of circuits included in the transmitter are the same as those of the transmitter including the first circuit 7 both at the time of the non-MIMO transmission and at the time of the MIMO transmission.

In the present embodiment, operation efficiency of the first power amplifier 2 and the second power amplifier 5 included in the transmitter at the time of MIMO transmission becomes equal to that at the time of non-MIMO transmission as heretofore described. If the same power amplifiers are used in the conventional MIMO transmitter, there is a problem that the operation efficiency of the power amplifiers is degraded at the time of non-MIMO transmission. However, it becomes possible to avoid this problem by implementing the present invention.

In the present embodiment, it becomes possible, in a MIMO transmitter required to transmit a signal by using only one transmitting series, to make the saturation level of the power amplifier included in each transmitting series equal to the saturation level needed at the time of MIMO transmission. As a result, it becomes unnecessary to increase the backoff level of the power amplifiers at the time of MIMO transmission, and consequently the power dissipation at the time of MIMO transmission can be reduced.

When transmitting a signal by using only one transmitting series, the Doherty amplifier is constructed using a plurality of power amplifiers included in the transmitter, in the present embodiment. Therefore, it becomes possible for the transmitter to satisfy the transmission level to be output while satisfying the distortion level prescribed by the wireless communication system.

Owing to the effects described heretofore, the MIMO transmitter required to transmit a signal by using only one transmitting series can be implemented with a small size and at low price.

The present embodiment has been described taking the quarter-wave line having the characteristic impedance of 50 Ω as an example of the impedance conversion unit and the phase adjustment unit and taking a switch as an example of a signal path changeover unit and a selector. The impedance conversion unit and the signal path changeover unit may be other circuits having the same effects as the quarter-wave line and the switch. The impedance values before and after the conversion may be different from those in the present embodiment.

In the description of the operation of the first circuit 7 and the second circuit 8, the expression "impedance matching is attained" has been used. Even if the impedance matching is not attained completely, there is no problem so long as impedance matching is attained to the extent that the transmitter is not hindered in wireless communication (for example, to the extent that the VSWR (Voltage Standing-Wave Ratio) between circuits is approximately 2 or less).

The second power amplifier 5 has been described by taking the case where the output impedance becomes sufficiently higher than 50Ω in the class C bias state as an example. Even if the output impedance of the second power amplifier 5 is not sufficiently high, however, there is no problem because the Doherty amplifier can be implemented by suitably selecting the characteristic impedance value and length of the quarter-wave line used in the first circuit 7 and the second circuit 8.

Each of the first modulation unit 1 and the second modulation unit 4 may have a configuration different from that shown in FIG. 2, so long as it has a function of outputting a signal of the modulated radio frequency.

The second power amplifier 5 has been described taking as an example the case where it is controlled by the control signal supplied from the baseband unit 9 so as to have class C bias when transmitting using only one transmitting series. Alternatively, the second power amplifier 5 may be a power amplifier that is adjusted in bias voltage and drive level so as to function as the sub amplifier in the Doherty amplifier by the control signal supplied from the baseband unit 9 in response to the input signal level.

The case where the signal output from the first modulation unit 1 is equally divided between the first power amplifier 2 and the second power amplifier 5 has been described as an example. Even if the division ratio is not equal, however, there is no problem.

The case where the first power amplifier 2 and the second power amplifier 5 are equal to each other in gain has been described as an example. If the first power amplifier 2 and the second power amplifier 5 are not equal to each other in gain, however, one or both of the first power amplifier 2 and the second power amplifier 5 may have a function of correcting the gain using a gain amplifier or an attenuator.

In the case where transmission power control is to be exercised to change the transmission power of the transmitter according to the situation of the signal propagation path, it can be implemented by providing a circuit such as a variable gain amplifier which makes the output power variable in the first modulation unit 1 and the second modulation unit 4.

In the present embodiment, a MIMO transmitter including two transmitting series is used. Also in the case where the present invention is applied to a MIMO transmitter including three transmitting series, it is possible to construct a Doherty amplifier by using the first circuit, the second circuit and three power amplifiers included in three transmitting series and using these three power amplifiers as one main amplifier and two sub amplifiers. It thus becomes possible to avoid the operation efficiency degradation of the power amplifiers at the time of MIMO transmission.

When the power amplifiers output signals at the same level under the condition that the operation conditions such as the bias voltage, the bias current and the environment temperature are the same, it is desirable that high frequency characteristics prescribed by the wireless communication system represented by the distortion characteristics and noise characteristics are at equal levels.

In the present embodiment, the first circuit and/or the second circuit may include a lumped constant circuit and switches. The lumped constant circuit may includes inductors and capacitors formed by the semiconductor process, or inductors and capacitors using chip components such as layered ceramic capacitors and thin film inductors.

In the present embodiment, the first circuit, the second circuit, and a plurality of power amplifiers may be a MMIC formed by the same semiconductor process.

In the present embodiment, the first circuit, the second circuit, and a plurality of power amplifiers, or an arbitrary combination of them may be a module implemented using wiring pattern and chip components on the same ceramic substrate or resin substrate.

What is claimed is:

1. A wireless transmitter comprising:
   a first modulation unit configured to modulate first input signal to first modulated signal;
   a second modulation unit configured to modulate second input signal to second modulated signal;
   a first amplifier configured to amplify the first modulated signal and output first amplified signal;
   a second amplifier configured to amplify the second modulated signal and output second amplified signal;
   a first antenna configured to radiate first amplified signal;
   a second antenna configured to radiate second amplified signal;
   a first path which conducts the first modulated signal to the first amplifier and conducts the second modulated signal to the second amplifier;
   a second path which divides the first modulated signal to conduct first divided signal to the first amplifier and second divided signal to the second amplifier;
   a first path changeover unit which conducts the first modulated signal and second modulated signal, to the first path or the second path selectively;
   a third path which conducts the first amplified signal to the first antenna, and conducts the second amplified signal to the second antenna;
   a fourth path which generates combined signal which is sum of the first amplified signal and the second amplified signal at a combining point, and conducts the combined signal to the first or second antenna;
   an impedance conversion unit which converts impedance between the first amplifier and the combining point;
   a second path changeover unit which conducts the first amplified signal and second amplified signal, to the third path or the fourth path selectively; and
   a control unit configured to set the first path changeover unit to conduct the first modulated signal and second modulated signal to the first path at the time to set the second path changeover unit to conduct the first amplified signal and second amplified signal to the third path, and configured to set the first path changeover unit to conduct the first modulated signal and second modulated signal to the second path at the time to set the second path changeover unit to conduct the first amplified signal and second amplified signal to the fourth path.

2. The wireless transmitter according to claim 1, wherein the control unit supplies a bias control signal to the second amplifier to control a bias voltage of the second amplifier.

3. The wireless transmitter according to claim 2, wherein the control unit supplies the bias control signal to the second amplifier to cause the second amplifier to operate in class AB at the time to set the first path changeover unit to conduct the first modulated signal and second modulated signal to the first path, and supplies a bias control signal to the second amplifier to cause the second amplifier to operate in class C at the time to set the first path changeover unit to conduct the first modulated signal and second modulated signal to the second path.

4. The wireless transmitter according to claim 1, wherein the control unit supplies a bias control signal to the second amplifier to control a bias current of the second amplifier.

5. The wireless transmitter according to claim 4, wherein the control unit supplies the bias control signal to the second amplifier to cause the second amplifier to operate in class AB at the time to set the first path changeover unit to conduct the first modulated signal and second modulated signal to the first path, and supplies a bias control signal to the second amplifier to cause the second amplifier to operate in class C at the time to set the first path changeover unit to conduct the first modulated signal and second modulated signal to the second path.

6. The wireless transmitter according to claim 1, wherein the first amplifier operates in class AB.

7. The wireless transmitter according to claim 1, wherein the second path has a phase adjustment unit on a path of the second divided signal.

8. The wireless transmitter according to claim 7, wherein the phase adjustment unit has a ¼+n wavelength line (where n is 0 or an arbitrary natural number).

9. The wireless transmitter according to claim 1, wherein the second path has a hybrid power divider which divides the first modulated signal into two signals having a phase difference of 90° between them.

10. The wireless transmitter according to claim 1, wherein the impedance conversion unit on the fourth path has a ¼+n wavelength line (where n is 0 or an arbitrary natural number).

11. The wireless transmitter according to claim 1, wherein the first path changeover unit and/or the second path changeover unit are switches.

12. The wireless transmitter according to claim 1, wherein the wireless transmitter has a lumped constant circuit and switches.

13. An amplifier comprising:
  a first amplifier configured to input a first input signal to obtain a first amplified signal;
  a second amplifier configured to input a second input signal to obtain a second amplified signal;
  a divider configured to input a part of the first input signal into the second amplifier as the second input signal, responsively to an external control signal;
  an impedance conversion unit configured to impedance-convert a supplied signal;
  a combiner configured to combine a signal impedance-converted by the impedance conversion unit and the second amplifield signal; and
  a selector configured to select supplying the first amplified signal for the impedance conversion unit to output a combine signal obtained by the combiner, responsively to the external control signal, or outputting the first amplified signal and the second amplified signal respectively.

14. The amplifier according to claim 13, wherein the first amplifier operates in class AB.

15. The amplifier according to claim 13, further comprising a phase adjustment unit configured to adjust a phase of the part of the first input signal to input the phase-adjusted signal into the second amplifier.

16. The amplifier according to claim 15, wherein the phase adjustment unit has a ¼+n wavelength line (where n is 0 or an arbitrary natural number).

17. The amplifier according to claim 15, wherein the divider is a hybrid power divider which divides the first input signal into two signals having a phase difference of 90° between them.

18. The amplifier according to claim 13, wherein the impedance conversion unit has a ¼+n wavelength line (where n is 0 or an arbitrary natural number).

19. The amplifier according to claim 13, wherein the divider and the selector are switches.

* * * * *